United States Patent
Chang et al.

(10) Patent No.: US 7,202,116 B2
(45) Date of Patent: Apr. 10, 2007

(54) THIN FILM TRANSISTOR SUBSTRATE FOR DISPLAY DEVICE AND FABRICATING METHOD THEREOF

(75) Inventors: Youn Gyoung Chang, Kyounggi-do (KR); Heung Lyul Cho, Kyounggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 21 days.

(21) Appl. No.: 10/969,869

(22) Filed: Oct. 22, 2004

(65) Prior Publication Data

US 2005/0087742 A1 Apr. 28, 2005

(30) Foreign Application Priority Data

Oct. 23, 2003 (KR) ............... 10-2003-0074138

(51) Int. Cl.
*H01L 21/00* (2006.01)
(52) U.S. Cl. .............. 438/149; 438/129; 257/72; 257/E29.151; 349/149
(58) Field of Classification Search ............. 438/48, 438/128, 129, 149, 151, 157
See application file for complete search history.

(56) References Cited

U.S. PATENT DOCUMENTS

| | | | | |
|---|---|---|---|---|
| 6,396,558 B1 * | 5/2002 | Kim et al. | .......... | 349/152 |
| 6,512,243 B1 * | 1/2003 | Kim et al. | .......... | 257/59 |
| 6,861,297 B2 * | 3/2005 | Kwak et al. | .......... | 438/149 |
| 6,985,193 B2 * | 1/2006 | Jang | .......... | 349/43 |
| 2002/0044242 A1* | 4/2002 | Kim | .......... | 349/139 |
| 2002/0145694 A1* | 10/2002 | Jang | .......... | 349/138 |

* cited by examiner

*Primary Examiner*—Thao X. Le
*Assistant Examiner*—Mursalin B. Hafiz
(74) *Attorney, Agent, or Firm*—Morgan, Lewis & Bockius, LLP

(57) ABSTRACT

A thin film transistor substrate for a display device having a plurality of thin film transistors and pixel electrodes connected to the thin film transistors, said thin film transistor substrate includes: a plurality of pad electrodes in a non-display area of the display device for applying signals to the plurality of thin film transistors in a non-display area of the display device; a protective film covering the pad electrodes in the non-display area; and a slit in the protective film adjacent to at least one of the plurality of pad electrodes.

18 Claims, 23 Drawing Sheets

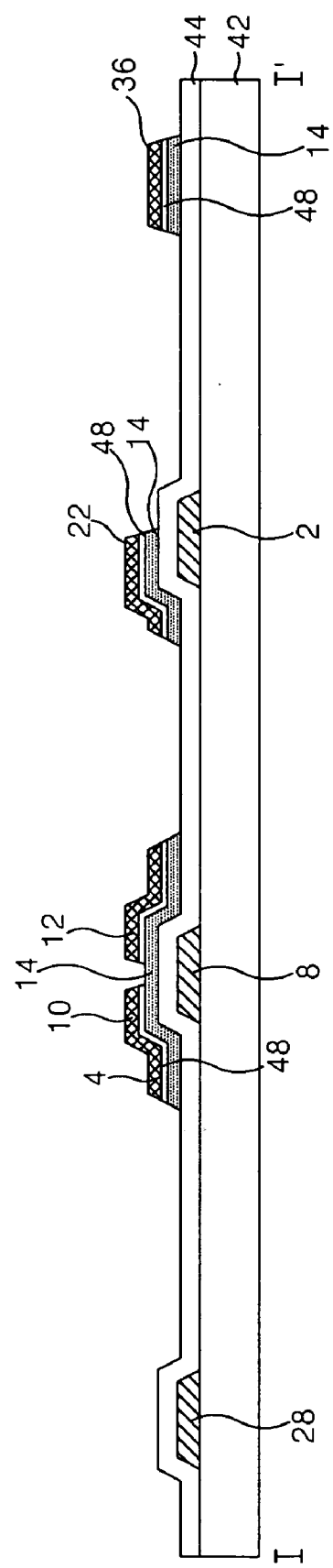

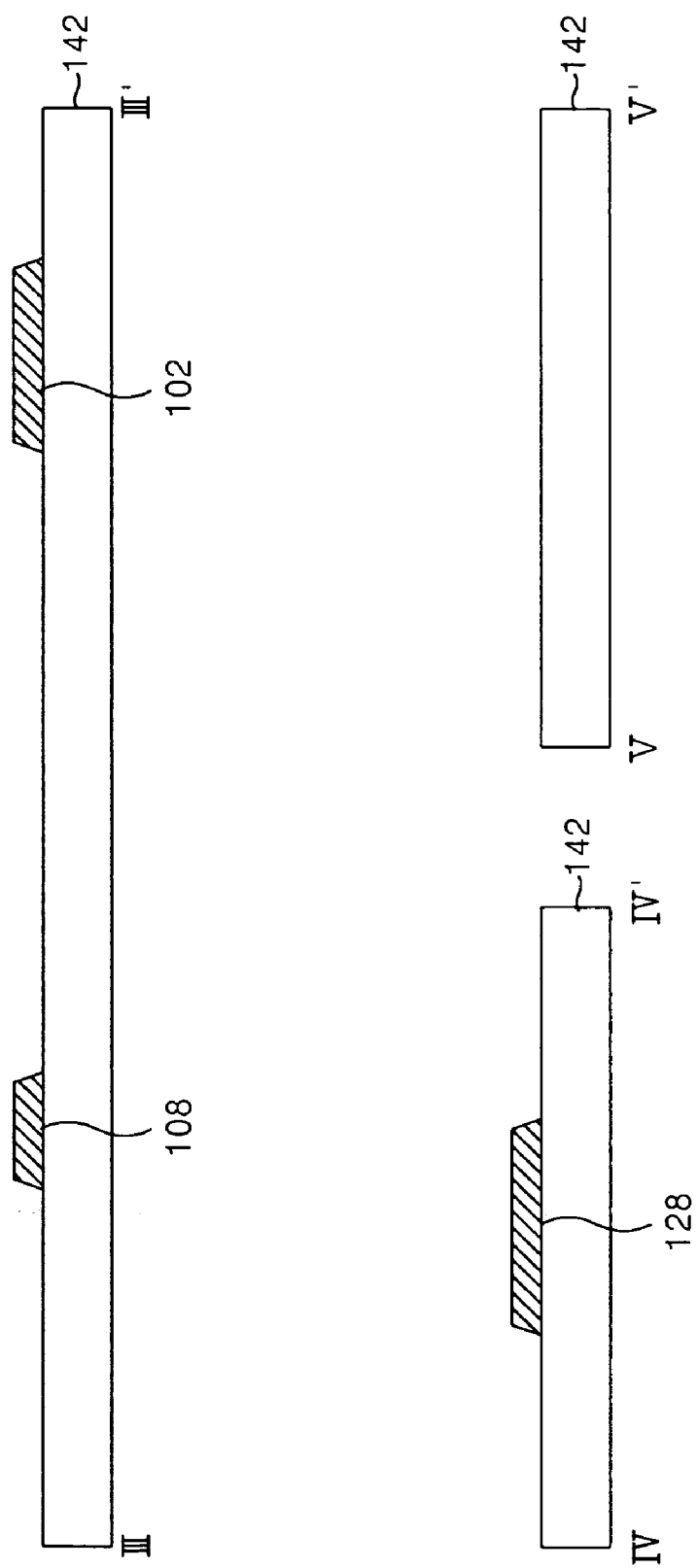

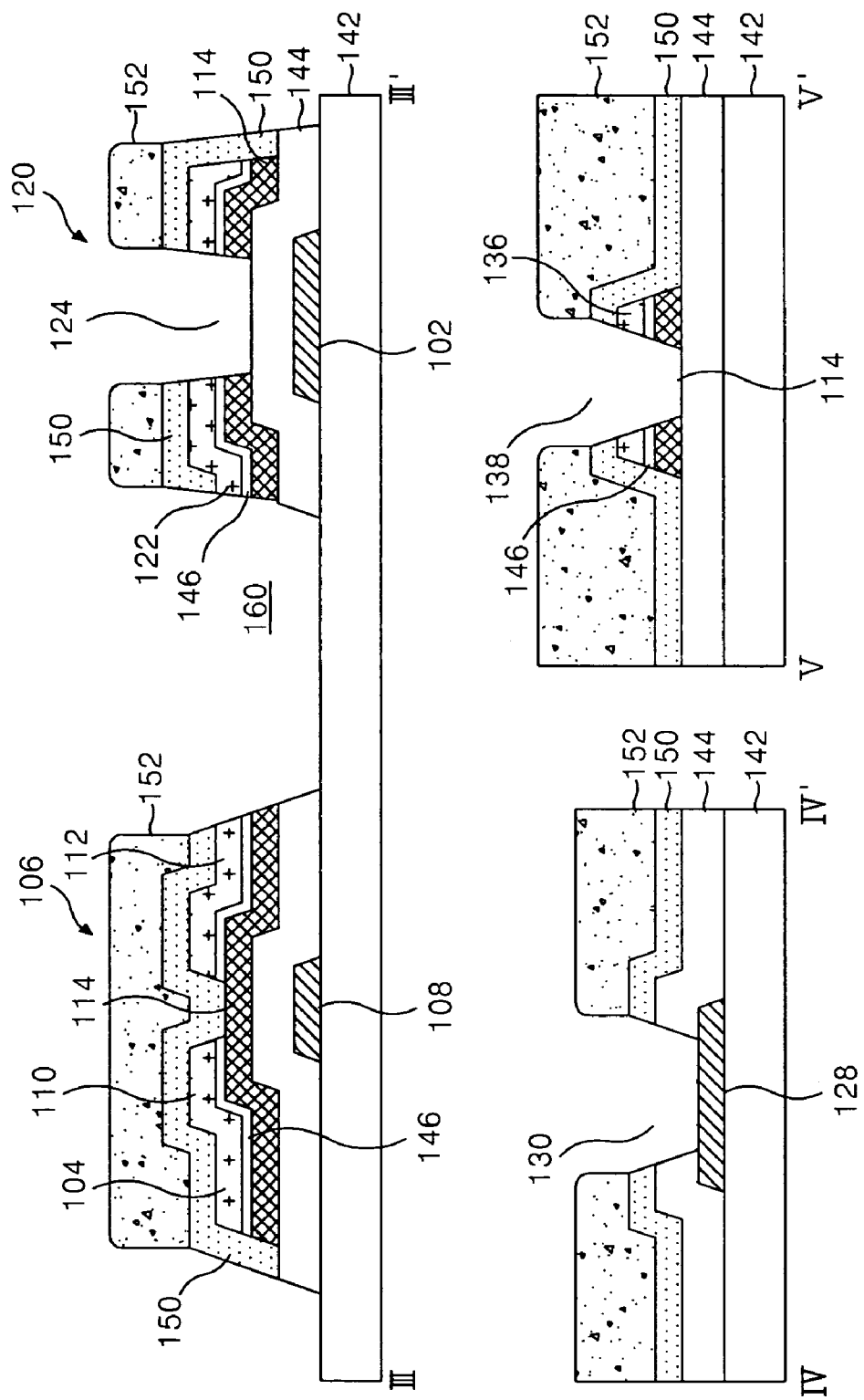

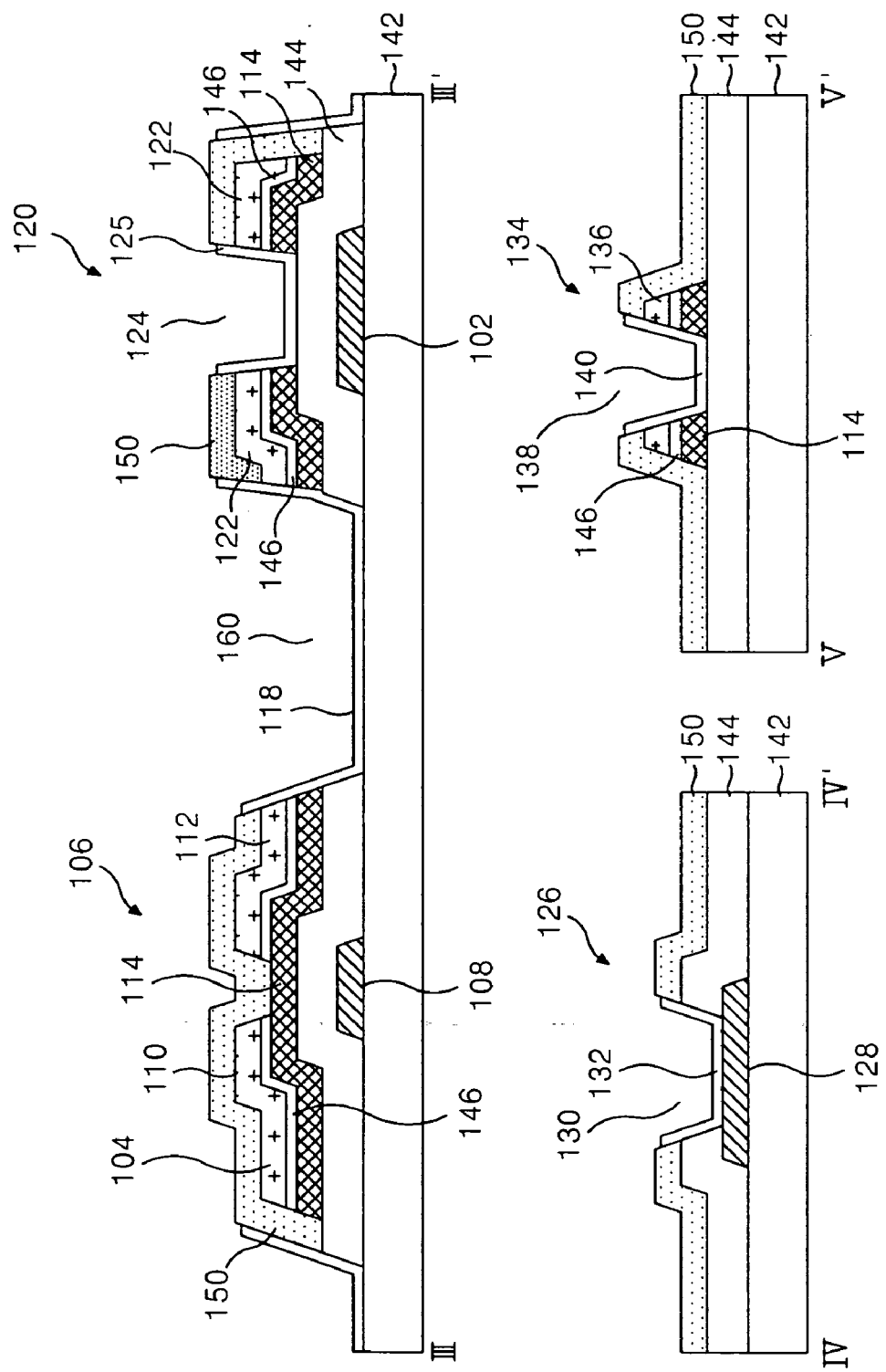

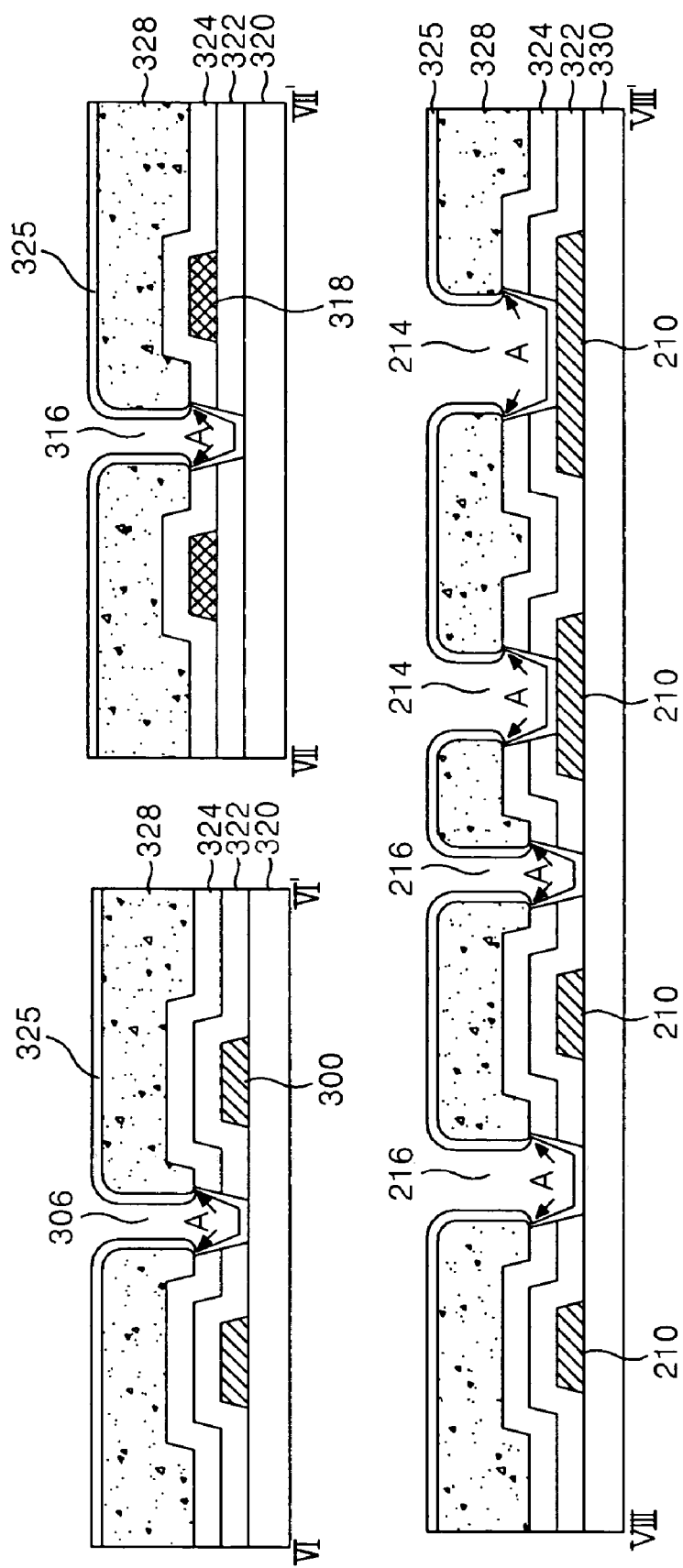

THIN FILM TRANSISTOR SUBSTRATE FOR DISPLAY DEVICE AND FABRICATING METHOD THEREOF

This application claims the benefit of Korean Patent Application No. P2003-74138 filed in Korea on Oct. 23, 2003, which is hereby incorporated by reference.

BACKGROUND OF THE INVENTION

1. Field of the Invention

This invention relates to a device of a liquid crystal display, and more particularly to a thin film transistor substrate for a display device and a fabricating method thereof.

2. Description of the Related Art

Generally, a liquid crystal display (LCD) controls light transmittance of a liquid crystal using an electric field to thereby display a picture. The LCD includes a liquid crystal display panel having liquid crystal cells arranged in a matrix, and a driving circuit for driving the liquid crystal display panel. The liquid crystal display panel includes a thin film transistor substrate and a color filter substrate that are opposed to each other, a liquid crystal injected between the two substrates, and a spacer for keeping a cell gap between the two substrates.

The thin film transistor substrate includes gate lines and data lines that cross each other. Liquid crystal cells are defined between adjacent pairs of gate lines and data lines. Thin film transistors are respectively formed adjacent to crossings of the gate lines and the data lines. The thin film transistor are switching devices connected to the data lines and gate lines. Pixel electrodes are formed in each liquid crystal cell and connected to the thin film transistor. An alignment film is coated onto the liquid crystal cells of thin film transistor substrate. The gate lines and the data lines receive signals from the driving circuits via pad portions on each of the lines. The thin film transistor applies a pixel signal to the pixel electrode from the data line in response to a scanning signal on the gate line.

The color filter substrate includes color filters formed in each liquid crystal cell. A black matrix on the color filter substrate divides the color filters. Common electrodes for commonly applying reference voltages to the liquid crystal cells are formed on the color filters. An alignment film is coated on the common electrode.

The liquid crystal display panel is assembled by joining the thin film array substrate and the color filter substrate together. Then, liquid crystal is injected between the thin film array substrate and the color filter substrate followed by a sealing of the hole in which the liquid crystal was injected. In manufacturing such a liquid crystal display, the process for forming the thin film transistor substrate is complicated and is a major factor in the manufacturing cost of the liquid crystal display panel. The semiconductor processes for forming the thin film transistor is expensive because it needs a plurality of masking processes. One mask process includes a lot of processes, such as thin film deposition, cleaning, photolithography, etching, photo-resist stripping and inspection processes, etc. In order to address the cost of the semiconductor processes, a thin film transistor substrate has been developed that can be produced with a reduced number of mask processes. Recently, a four-round mask process, which has one less mask process than the existing standard five-round mask process, has been developed.

FIG. 1 is a plan view illustrating a thin film transistor substrate fabricated by a four-round mask process, and FIG. 2 is a cross-section view of the thin film transistor substrate taken along the I–I' line in FIG. 1. Referring to FIG. 1 and FIG. 2, the thin film transistor substrate includes a gate line 2 and a data line 4 provided on a lower substrate 42 in such a manner as to cross each other with a gate insulating film 44 therebetween. A thin film transistor 6 is provided adjacent to each crossing. A pixel electrode 18 connected to the thin film transistor 6 is provided in a cell area defined by the gate line 2 and the data line 4. Further, the thin film transistor substrate includes a storage capacitor 20 provided where the pixel electrode 18 overlaps the gate line 2 of another cell area. A gate pad portion 26 is connected to the gate line 2 and a data pad portion 34 is connected to the data line 4.

The thin film transistor 6 includes a gate electrode 8 connected to the gate line 2, a source electrode 10 connected to the data line 4, a drain electrode 12 connected to the pixel electrode 18. An active layer 14 overlaps the gate electrode 8 and has a channel between the source electrode 10 and the drain electrode 12. The active layer 14 also overlaps with the data line 4, a lower data pad electrode 36 and an upper storage electrode 22, as shown in FIG. 2. On the active layer 14, an ohmic contact layer 48 for making an ohmic contact with the data line 4, the source electrode 10, the drain electrode 12, the lower data pad electrode 36 and the upper storage electrode 22 is further provided. The thin film transistor 6 provides a pixel signal to the pixel electrode 18 from the data line 4 in response to a scanning signal applied to the gate line 2.

The pixel electrode 18 is connected, via a first contact hole 16 passing through a protective film 50, to the drain electrode 12 of the thin film transistor 6. A potential difference between the common electrode provided at an upper substrate (not shown) and the pixel electrode is generated when a pixel signal is applied to the pixel electrode. This potential difference rotates liquid crystal positioned between the thin film transistor substrate and the upper substrate due to dielectric anisotropy of the liquid crystal and light from a light source (not shown) can transmit therethrough.

The storage capacitor 20 consists of an upper storage electrode 22 overlapping the gate line 2 of another cell area with a gate insulating film 44, the active layer 14 and the ohmic contact layer 48 therebetween. The pixel electrode 18 overlaps the upper storage electrode 22 with the protective film 50 therebetween and is connected via a second contact hole 24 in the protective film 50. The storage capacitor 20 allows a pixel signal charged in the pixel electrode 18 to be stably maintained until the next pixel signal.

The gate line 2 is connected, via the gate pad portion 26, to a gate driver (not shown). The gate pad portion 26 consists of a lower gate pad electrode 28 extending from the gate line 2, and an upper gate pad electrode 32 connected, via a third contact hole 30 passing through the gate insulating film 44 and the protective film 50, to the lower gate pad electrode 28. The data line 4 is connected, via the data pad portion 34, to the data driver (not shown). The data pad portion 34 consists of a lower data pad electrode 36 extended from the data line 4, and an upper data pad electrode 40 connected, via a fourth contact hole 38 passing through the protective film 50, to the lower data pad electrode 36.

Hereinafter, a method of fabricating the thin film transistor substrate having the above-mentioned structure adopting the four-round mask process will be described in detail with reference to FIG. 3A to FIG. 3D. Referring to FIG. 3A, gate metal patterns including the gate line 2, the gate electrode 8 and the lower gate pad electrode 28 are provided on the lower substrate 42 by the first mask process.

First, a gate metal layer is formed on the lower substrate 42 by a deposition technique, such as sputtering. Then, the gate metal layer is patterned by photolithography. An etching process using a first mask is then performed to thereby form gate metal patterns including the gate line 2, the gate electrode 8 and the lower gate pad electrode 28. The gate metal layer can be a single-layer or double-layer structure of chrome (Cr), molybdenum (Mo) or an aluminum group metal, etc.

Referring to FIG. 3B, the gate insulating film 44 is coated onto the lower substrate 42 provided with the gate metal patterns. Further, a semiconductor pattern including the active layer 48 is provided on the gate insulating film 44 using a second mask. In addition, the ohmic contact layer 48 and source/drain metal patterns including the data line 4, the source electrode 10, the drain electrode 12, the lower data pad electrode 36 and the upper storage electrode 22 are also provided in the second mask process.

More specifically, the gate insulating film 44, an amorphous silicon layer, a $n^+$ amorphous silicon layer and a source/drain metal layer are sequentially provided on the lower substrate 42 provided with the gate metal patterns by deposition techniques, such as the plasma enhanced chemical vapor deposition (PECVD) and the sputtering, etc. Herein, the gate insulating film 44 is formed from an inorganic insulating material, such as silicon nitride ($SiN_x$) or silicon oxide ($SiO_x$). The source/drain metal is selected from molybdenum (Mo), titanium (Ti), tantalum (Ta) or a molybdenum alloy, etc.

Then, a photo-resist pattern is formed on the source/drain metal layer by photolithography using the second mask. In this case, a diffractive exposure mask having a diffractive exposing part at a channel portion of the thin film transistor is used as a second mask, thereby allowing a photo-resist pattern of the channel portion to have a lower height than other source/drain pattern portion.

Subsequently, the source/drain metal layer is patterned by a wet etching process using the photo-resist pattern to thereby provide the source/drain metal patterns including the data line 4, the source electrode 10, the drain electrode 12 being integral to the source electrode 10 and the upper storage electrode 22. Next, the $n^+$ amorphous silicon layer and the amorphous silicon layer are patterned at the same time by a dry etching process using the same photo-resist pattern to thereby provide the ohmic contact layer 48 and the active layer 14.

The photo-resist pattern having a relatively low height is removed from the channel portion by the ashing process and thereafter the source/drain metal pattern and the ohmic contact layer 48 of the channel portion are etched by the dry etching process. Thus, the active layer 14 of the channel portion is exposed to disconnect the source electrode 10 from the drain electrode 12. Then, the photo-resist pattern left on the source/drain metal pattern group is removed by the stripping process.

Referring to FIG. 3C, the protective film 50 including the first to fourth contact holes 16, 24, 30 and 38 are formed on the gate insulating film 44 provided with the source/drain metal patterns. More specifically, the protective film 50 is entirely formed on the gate insulating film 44 provided with the source/drain metal patterns by a deposition technique, such as the plasma enhanced chemical vapor deposition (PECVD). Then, the protective film 50 is patterned by photolithography and the etching process using a third mask to thereby define the first to fourth contact holes 16, 24, 30 and 38. The first contact hole 16 is formed to pass through the protective film 50 and expose the drain electrode 12, whereas the second contact hole 24 is formed to pass through the protective film 50 and expose the upper storage electrode 22. The third contact hole 30 is formed to pass through the protective film 50 and the gate insulating film 44 and expose the lower gate pad electrode 28. The fourth contact hole 38 is formed to pass through the protective film 50 and expose the upper data pad electrode 36.

The protective film 50 is made from an inorganic insulating material identical to the gate insulating film 44, or an organic insulating material, such as an acrylic organic compound having a small dielectric constant, BCB (benzocyclobutene) or PFCB (perfluorocyclobutane), etc.

Referring to FIG. 3D, transparent conductive film patterns including the pixel electrode 18, the upper gate pad electrode 32 and the upper data pad electrode 40 are provided on the protective film 50 by the fourth mask process.

A transparent conductive film is entirely deposited onto the protective film 50 by a deposition technique such as the sputtering, etc. Then, the transparent conductive film is patterned by the photolithography and the etching process using a fourth mask to thereby provide the transparent conductive film patterns including the pixel electrode 18, the upper gate pad electrode 32 and the upper data pad electrode 40. The pixel electrode 18 is electrically connected, via the first contact hole 16, to the drain electrode 12 while being electrically connected, via the second contact hole 24, to the upper storage electrode 22. The upper gate pad electrode 32 is electrically connected, via the third contact hole 30, to the lower gate pad electrode 28. The upper data pad electrode 40 is electrically connected, via the fourth contact hole 38, to the lower data pad electrode 36. Herein, the transparent conductive film is formed from indium-tin-oxide (ITO), tin-oxide (TO) or indium-zinc-oxide (IZO).

As described above, the related art thin film transistor substrate and the fabricating method thereof is a four-mask process, which reduces the number of fabricating processes and hence reducing manufacturing cost in proportion to the reduced number of fabricating processes in comparison with those used in the five-mask process. However, the four-round mask process is still a complicated and expensive fabricating process. Thus, there is still a need to simplify the fabricating process and to further reduce the manufacturing cost.

SUMMARY OF THE INVENTION

Accordingly, the present invention is directed to a thin film transistor substrate for a display device and a fabricating method thereof that substantially obviates one or more of the problems due to limitations and disadvantages of the related art.

Accordingly, it is an object of the present invention to provide a thin film transistor substrate for a display device and a fabricating method thereof having a simplified process by using a lift-off process.

Another object of the present invention is to provide a thin film transistor substrate for a display device and a fabricating method thereof having an improved lift-off ability.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

In order to achieve these and other objects of the invention, a thin film transistor substrate for a display device has a plurality of thin film transistors and pixel electrodes connected to the thin film transistors, said thin film transistor substrate includes: a plurality of pad electrodes in a non-display area of the display device for applying signals to the plurality of thin film transistors in a non-display area of the display device; a protective film covering the pad electrodes in the non-display area; and a slit in the protective film adjacent to at least one of the plurality of pad electrodes.

In another aspect, a method of fabricating a thin film transistor substrate for a display device has a display area with plurality of thin film transistors and pixel electrodes connected to the thin film transistors, includes the steps of: forming a plurality of pad electrodes in a non-display area of the display device for applying signals to the thin film transistors in the display area of the display device; forming an insulating film covering the pad electrodes; forming a slit in the insulating film adjacent to a pad electrode using a photo-resist pattern; removing the photo-resist pattern with a stripper that infiltrate through the slit.

In yet another aspect, a method of fabricating a thin film transistor substrate for a display device having a plurality of thin film transistors and pixel electrodes connected to the thin film transistors, includes the steps of: forming a gate insulating film in a display area and in a non-display area of the display device; forming a plurality of signal lines on the gate insulating film in the non-display area for applying signals to the thin film transistors in the display area; forming a protective film covering the thin film transistors and the signal lines; patterning the protective film and the gate insulating film to form a slit adjacent to the plurality of signal lines; forming a transparent conductive film on a photo-resist pattern covering the protective film; and removing the photo-resist pattern covered by the transparent conductive film with a stripper that infiltrates between the photo-resist pattern and the protective film through the slit.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 3A to FIG. 3D are section views illustrating a method of fabricating the thin film transistor substrate shown in FIG. 2 step by step.

FIG. 6A to FIG. 6F are cross-sectional views illustrating step by step a method of fabricating the thin film transistor substrate shown in FIG. 5.

FIG. 10A to FIG. 10C are cross-sectional views illustrating step by step a method of fabricating the thin film transistor substrate shown in FIG. 7B, FIG. 8B and FIG. 9B.

DETAILED DESCRIPTION OF THE PREFERRED EMBODIMENTS

Reference will now be made in detail to the preferred embodiments of the present invention, examples of which are illustrated in the accompanying drawings. Hereinafter, the preferred embodiments of the present invention will be described in detail with reference to FIGS. 4 to 10C.

Figure 1:
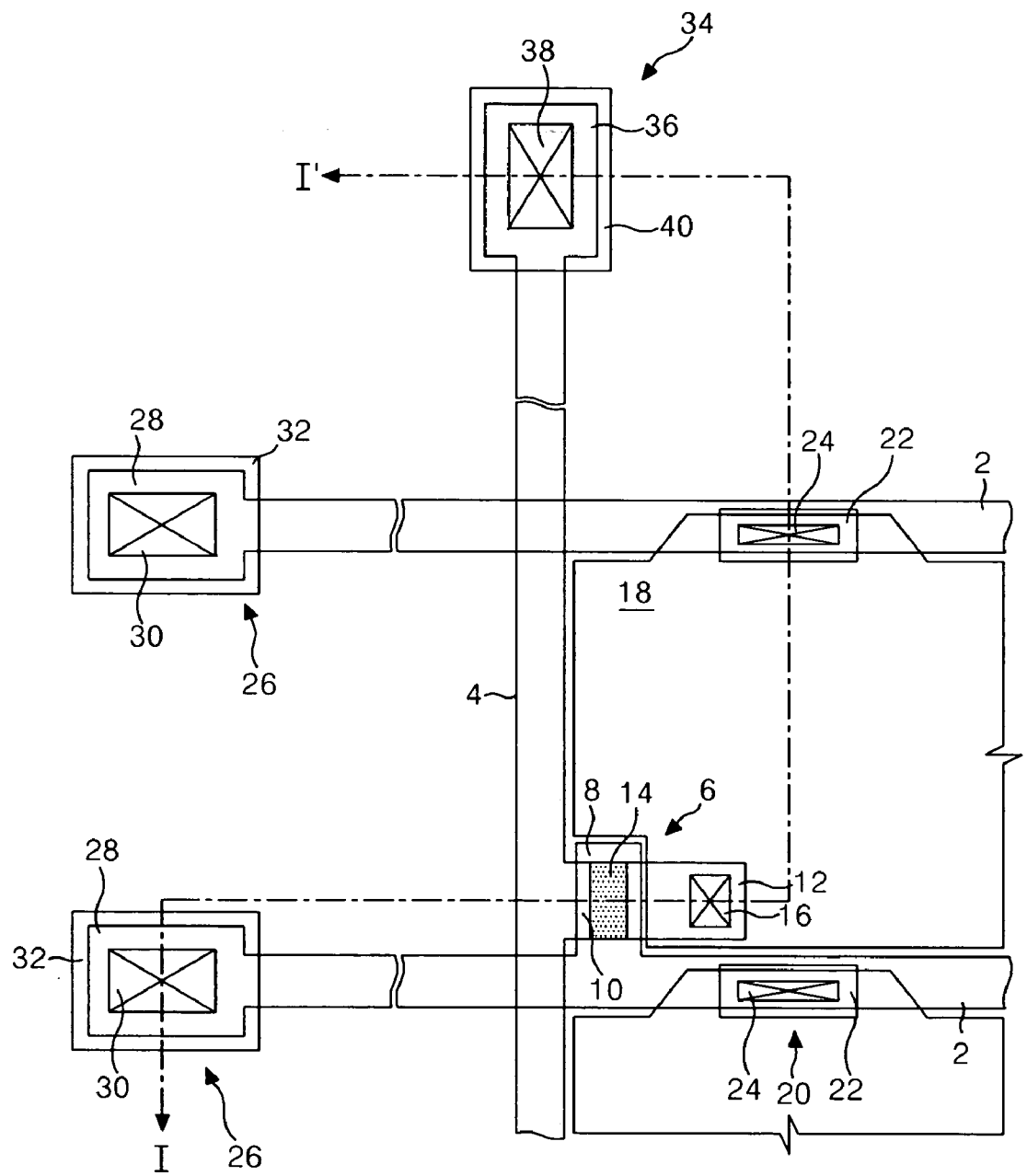
FIG. 1 is a plan view showing a portion of a related art thin film transistor substrate.
Figure 2:
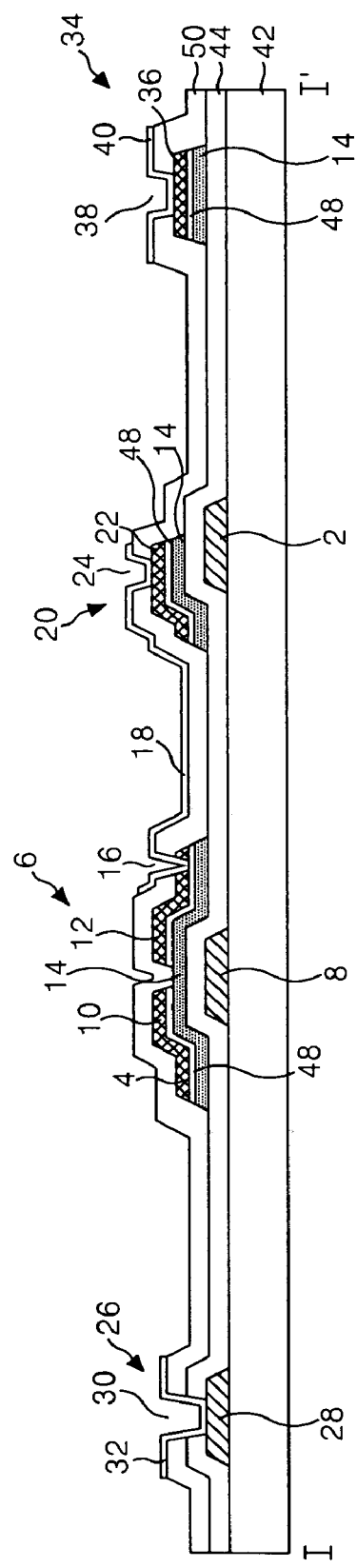
FIG. 2 is a section view of the thin film transistor substrate taken along the I–I' line in FIG. 1.
Figure 3A:
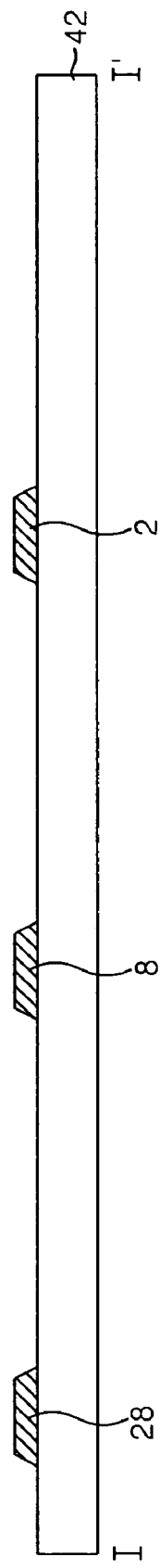
Figure 3C:
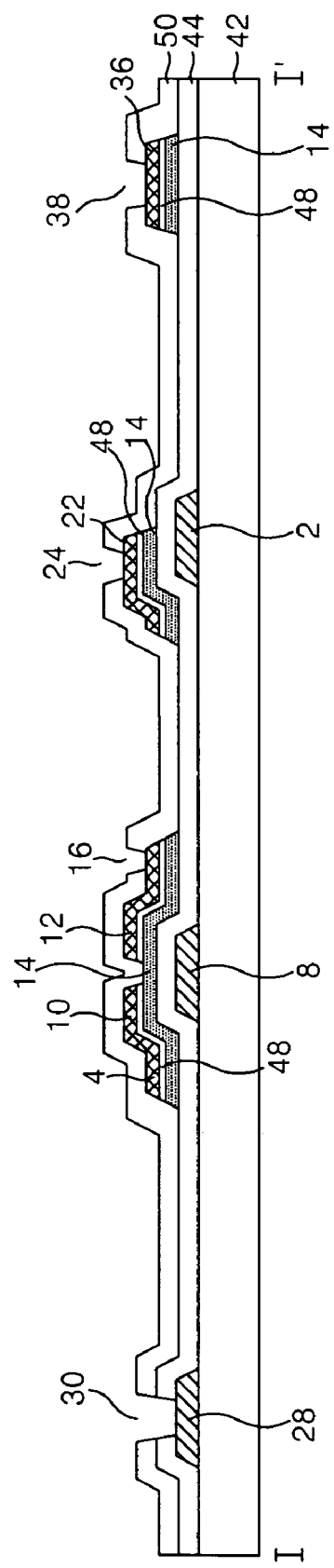
Figure 3D:
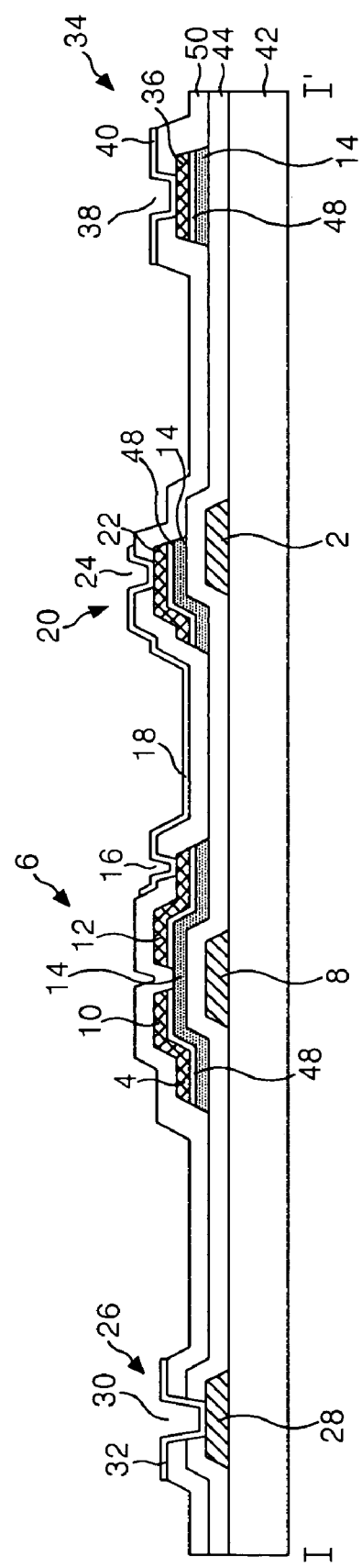
Figure 4:
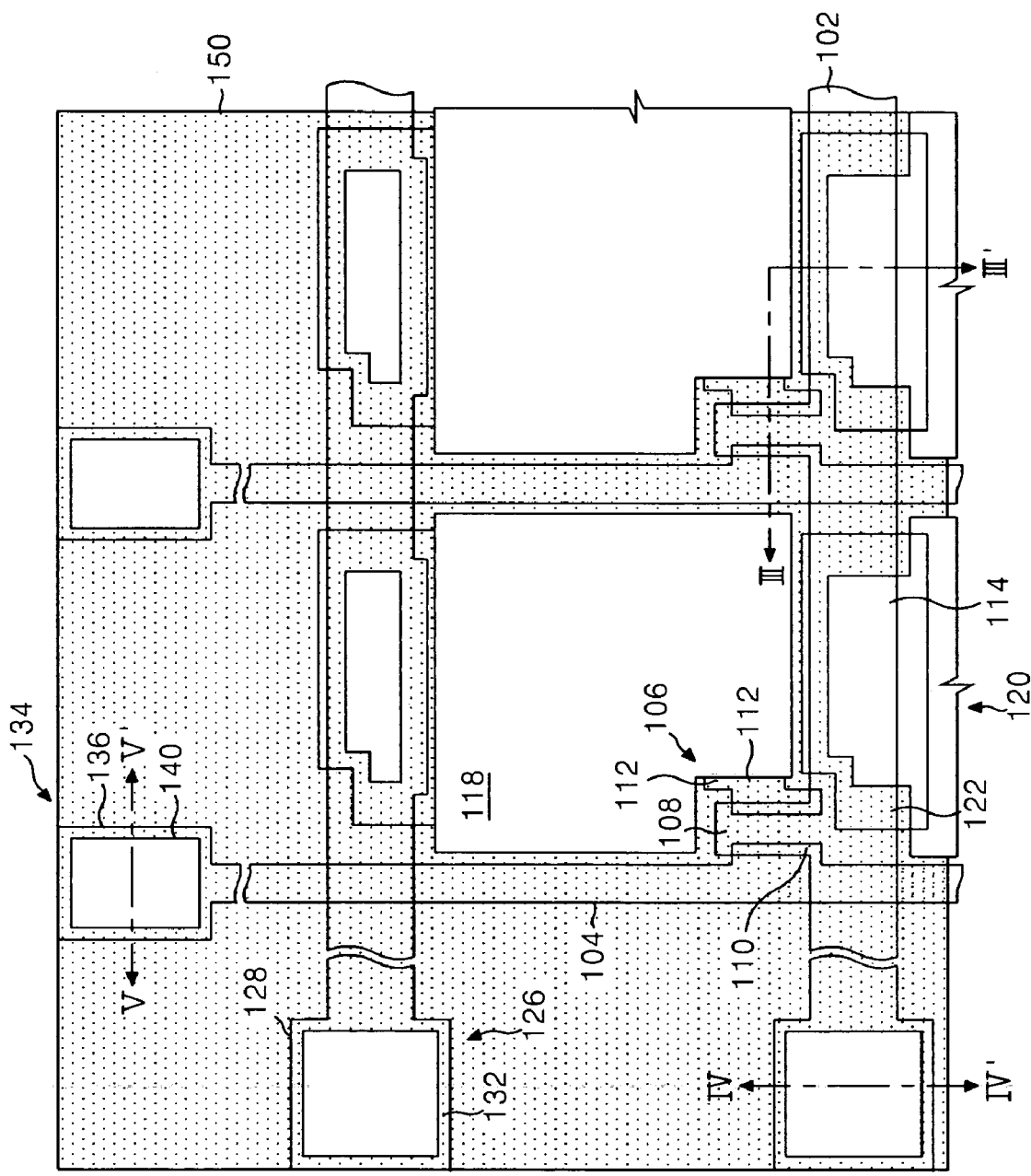
FIG. 4 is a plan view showing a portion of a thin film transistor substrate according to an embodiment of the present invention.
Figure 5:
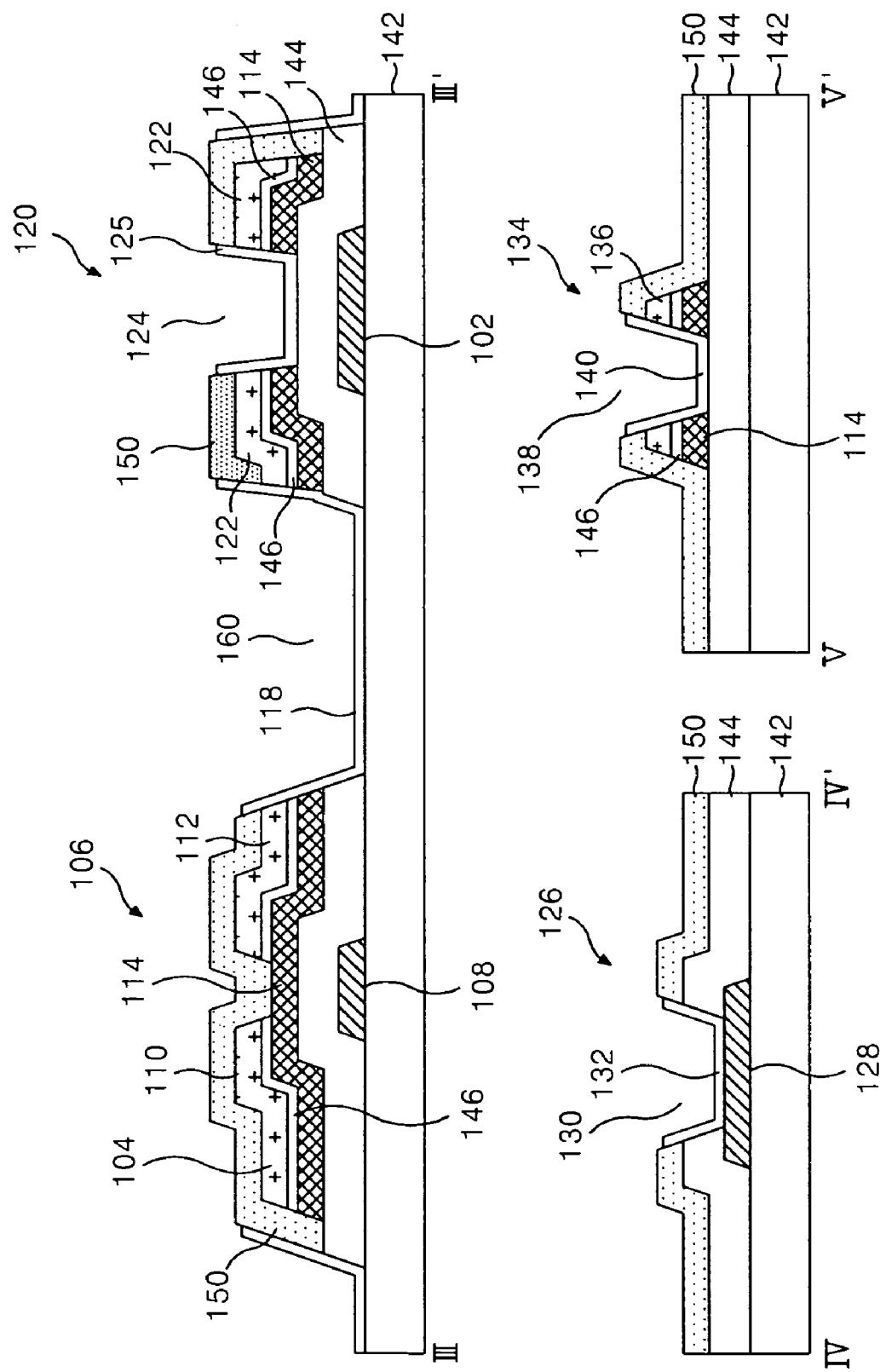
FIG. 5 is a cross-sectional view of the thin film transistor substrate taken along the III–III', IV–IV' and V–V' lines in FIG. 4.

FIG. 4 is a plan view showing a portion of a thin film transistor substrate according to an embodiment of the present invention, and FIG. 5 is a cross-sectional view of the thin film transistor substrate taken along the III–III', IV–IV' and V–V' lines in FIG. 4. Referring to FIG. 4 and FIG. 5, the thin film transistor substrate includes a gate line 102 and a data line 104 crossing each other on a lower substrate 142 with a gate insulating film 144 between the lower substrate 142 and the lines. A thin film transistor 106 is provided adjacent to a crossing of the gate line 102 and the data line 104. A pixel electrode 118 provided in a pixel area defined by the gate line 102 and the data line 104. The pixel electrode 118 is connected to the thin film transistor. Further, the thin film transistor substrate includes a storage capacitor 120 overlapping the gate electrode 102 of another pixel area in which a first upper storage electrode 122 and second upper storage electrode 125 are connected to the pixel electrode 118. A gate pad 126 is connected to the gate line 102. A data pad 134 is connected to the data line 104.

The thin film transistor 106 includes a gate electrode 108 connected to the gate line 102, a source electrode 110 connected to the data line 104, a drain electrode 110 positioned opposite to the source electrode 110, an active layer 114 overlapping the gate electrode 108 with a gate insulating film 144 positioned therebetween. The active layer 114 has a channel portion between the source electrode 110 and the drain electrode 112. Ohmic contact layers 146 are formed on the active layer 114 at portions other than where the channel portion is located to form ohmic contacts for the source electrode 110 and the drain electrode 112. Further, the active layer 114 and the ohmic contact layers 146 overlap the data line 104, the lower data pad electrode 136 and the first upper storage electrode 122.

A pixel hole 160 passing through the protective film 150 and the gate insulating film 144 is provided in the pixel area adjacent to the crossing between the gate line 102 and the data line 104. The pixel electrode 118 interfaces with the protective film 150 within the pixel hole 160. Further, the pixel electrode 118 is connected, on a side surface basis, to a portion of the drain electrode 112 exposed upon formation of the pixel hole 160.

The storage capacitor 120 includes the gate line 102 of another pixel area as the lower storage electrode, and the first and second upper storage electrodes 122 and 125 overlap the lower storage electrode with gate insulating film 144 between the gate line 102 of another pixel area and the upper electrodes 122 and 125. The pixel electrode 118 is connected, on a side surface basis, to a portion of the first upper storage electrode 122 exposed during formation of the pixel hole 160. The second upper storage electrode 125 is formed within a first contact hole 124 passing through the ohmic contact layer 146. The active layer 114 is connected, on a side surface basis, to the first upper storage electrode 122. Thus, there is in effect a reduction in distance between the second upper storage electrode 125 and the gate line 102 of another pixel area so that a capacitance value of the storage capacitor 120 is enlarged since there is only the gate insulating film 144 between the second upper electrode 125 and the gate line 102 of another pixel area.

The gate pad 126 consists of a lower gate pad electrode 128 extending from the gate line 102, and an upper gate pad electrode 132 formed within the first contact hole 130 passing through the protective film 150 and the gate insulating film 144 to be connected to the lower gate pad electrode 128. The data pad 134 consists of a lower data pad electrode 136 extending from the data line 104, and an upper data pad electrode 140 connected to the side surface of the lower data pad electrode 136. The upper data electrode 140 is formed within a second contact hole 138 passing through the protective film 150, the lower data pad electrode 136, the ohmic contact layer 146 and the active layer 114.

Figure 6B:
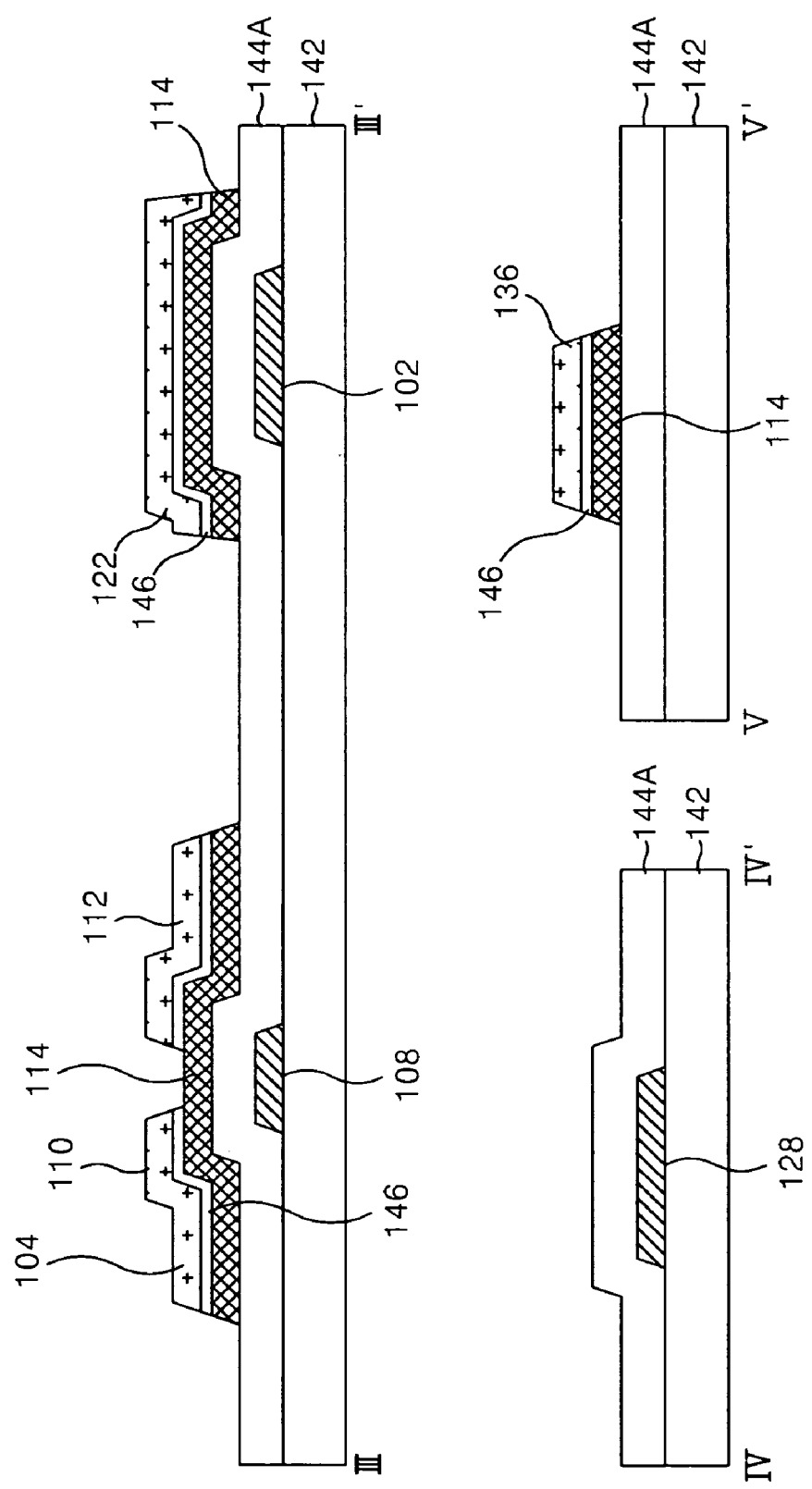

The thin film transistor substrate having the above-mentioned structure according to an embodiment of the present invention is provided by the following three-round mask process as shown FIG. 6A to FIG. 6F due to the use of a lift-off process. Referring to FIG. 6A, a gate metal pattern, which includes the gate line 102, the gate electrode 106 connected to the gate line 102 and the lower gate pad electrode 128, is formed on the lower substrate 142 by a first mask process.

More specifically, the first mask process includes forming a gate metal layer on the lower substrate 142 by a deposition technique, such as sputtering. Then, the gate metal layer is patterned by photolithography and an etching process using a first mask to form the gate metal pattern including the gate line 102, the gate electrode 108 and the lower gate pad electrode 128. The gate metal can be made from Cr, MoW, Cr/Al, Cu, Al(Nd), Mo/Al, Mo/Al(Nd) or Cr/Al(Nd).

Referring to FIG. 6B, a gate insulating film 144A is formed, and thereafter a semiconductor pattern including the active layer 114 and the ohmic contact layer 146 is formed by a second mask process. In addition, a source/drain metal pattern including the data line 104, the source electrode 110, the drain electrode 112, the lower data pad electrode 136 and the first upper storage electrode 122 overlapping the gate line 102 is also formed using the second mask process.

The second mask process can begin with the gate insulating film 144A. An amorphous silicon layer, an n$^+$ amorphous silicon layer and a source/drain metal layer are sequentially formed on the lower substrate 142 provided with the gate metal pattern by a deposition technique, such as PECVD or sputtering. The gate insulating film 144A can be formed from an inorganic insulating material, such as silicon nitride ($SiN_x$) or silicon oxide ($SiO_x$). The source/drain metal can be made from Cr, MoW, Cr/Al, Cu, Al(Nd), Mo/Al, Mo/Al(Nd) or Cr/Al(Nd).

Next, a photo-resist is coated onto the source/drain metal layer and then a photo-resist pattern having a relatively low height corresponding to the channel portion of the thin film transistor is formed by photolithography using a second mask that is a partial exposure mask. The source/drain metal layer is patterned by a wet etching process using the photo-resist pattern to form a source/drain metal pattern including the data line 104, the source electrode 110 of the thin film transistor, the drain metal pattern 112 integral to the source electrode 110 and the first upper storage electrode 122 overlapping the gate line 102. Further, the n$^+$ amorphous silicon layer and the amorphous silicon layer are simultaneously patterned by a dry etching process using the same photo-resist pattern to form a structure in which the ohmic contact layer 146 and the active layer 114 are formed along with the source/drain metal pattern.

Next, the photo-resist pattern corresponding to the channel portion having a relatively low height is removed by an ashing process, and thereafter the source/drain metal pattern and the ohmic contact layer 146 at the channel portion of the thin film transistor are etched by a dry etching process to separate the source electrode 110 from the drain electrode 112 and exposing the active layer 114. Further, the photo-resist pattern remaining on the source/drain metal pattern portion is then entirely removed by a stripping process.

Referring to FIG. 6C to FIG. 6F, a protective film 150A is formed over the lower substrate 142. Then, the entire protective film 150A and the gate insulating film 144A are patterned by a third mask process to form the pixel hole 160 and the first to third contact holes 124, 130 and 138. A transparent conductive pattern including the pixel electrode 118, the upper gate pad electrode 132, the upper data pad electrode 140 and the second upper storage electrode 125 is then formed by a lift-off process.

Figure 6C:
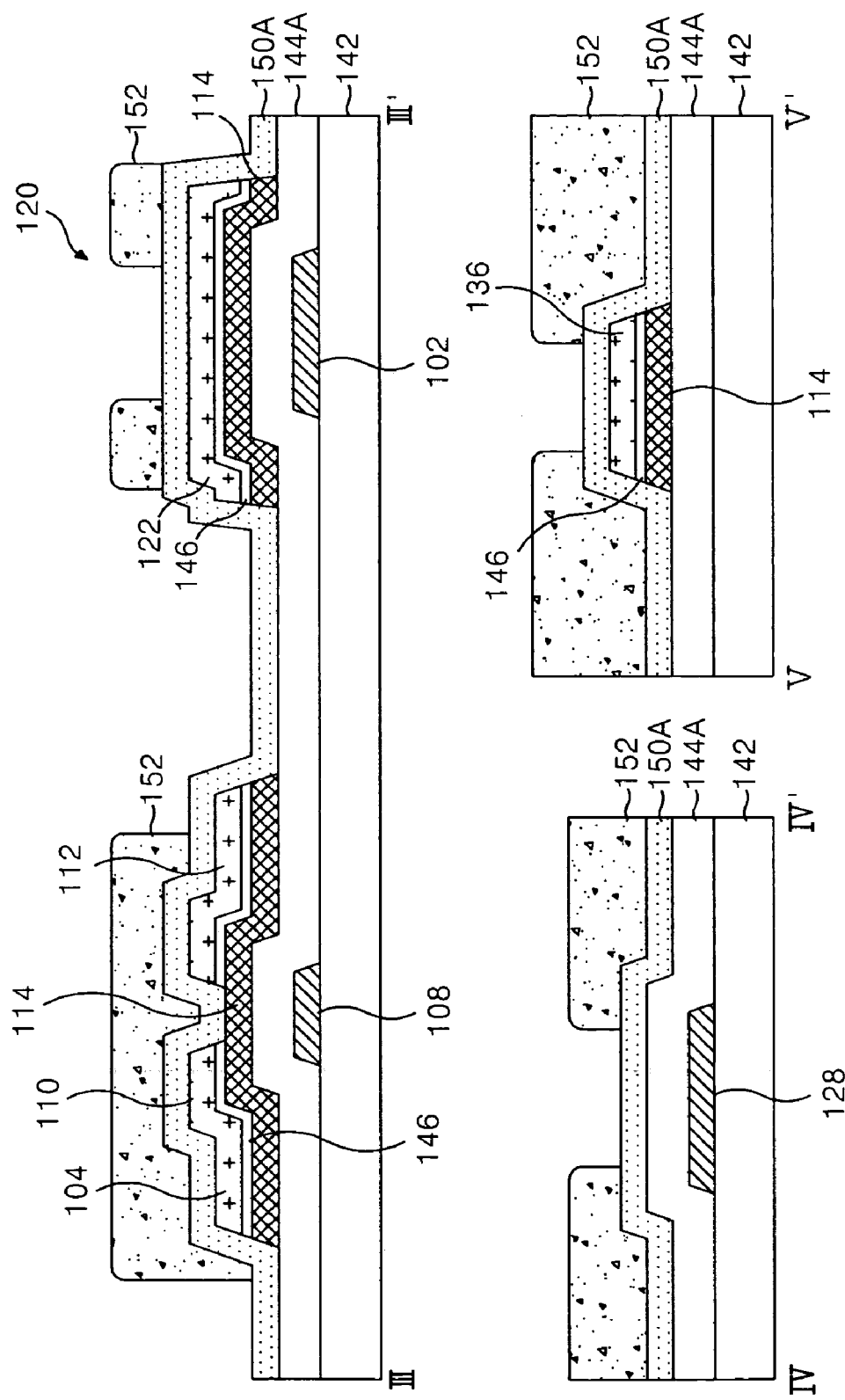

More specifically, the third masking process can begin by forming a protective film 150A over the entire gate insulating film 144A and the source/drain metal pattern, as shown in FIG. 6C. The protective film 150A is made from an inorganic insulating material or an organic insulating material similar to the gate insulating film 144A. Further, a photo-resist pattern 152 is formed over the entire protective film 150A by photolithography using the third mask.

Subsequently, the entire protective film 150A and the gate insulating film 144A are patterned by an etching process using the photo-resist pattern 152 to form the protective film 150 and the gate insulating film 144 having the pixel hole 160, and the first to third contact holes 124, 130 and 138, as shown in FIG. 6D. In this case, when the source/drain metal is formed from a material etched by the dry etching, portions of the drain electrode 112, the first upper storage electrode 122 and the upper data pad electrode 136 that do not overlap with the photo-resist pattern 152 and a portion of the source/drain metal pattern are etched along with the ohmic contact layer 146 and the active layer 114 under them.

Figure 6E:
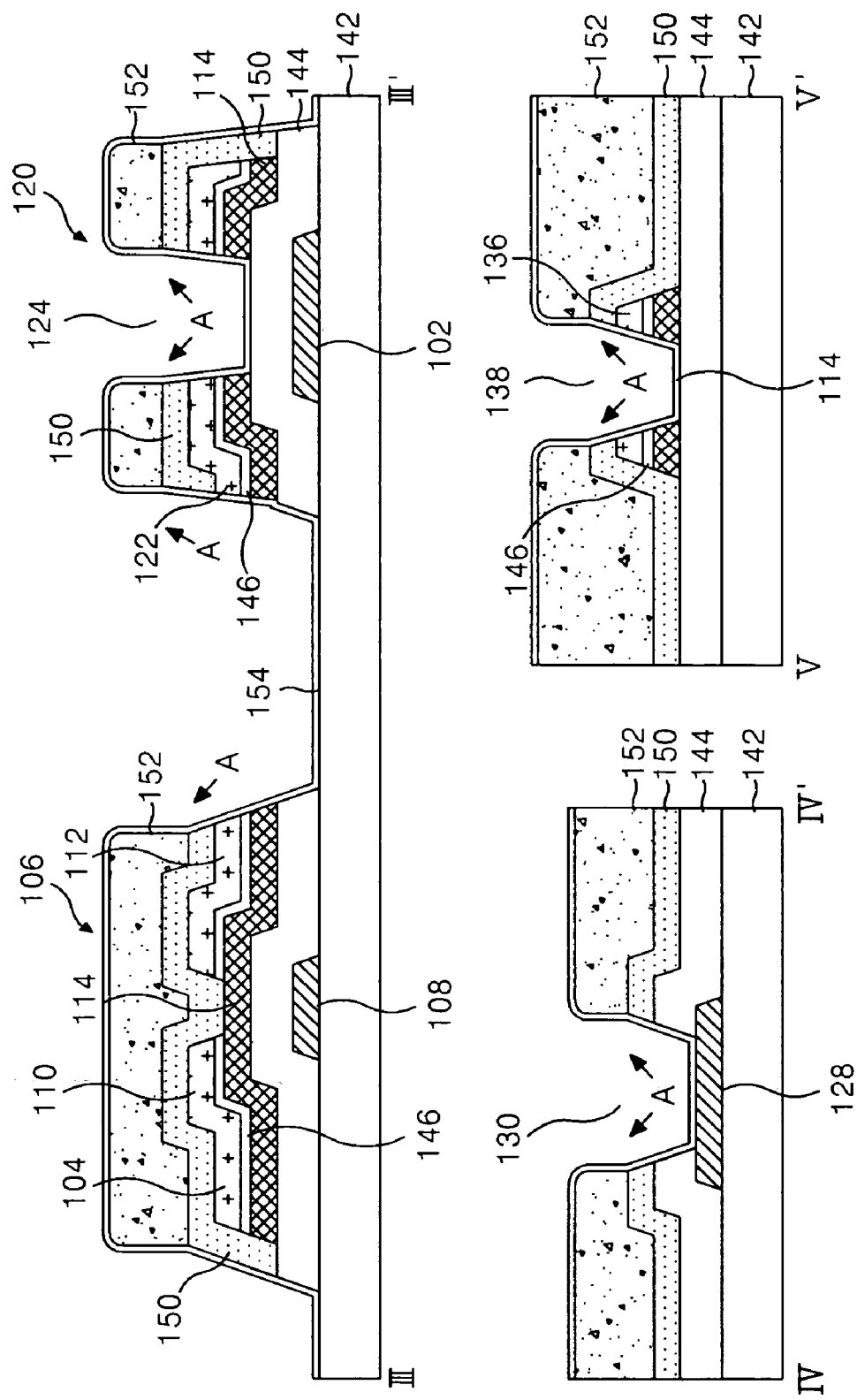

Next, a transparent conductive film 154 is formed over the thin film transistor substrate having the photo-resist pattern 152, as shown in FIG. 6E, by a deposition technique, such as sputtering or the like. The transparent conductive film 154 can be indium-tin-oxide (ITO), tin-oxide (TO), indium-zinc-oxide (IZO), $S_nO_2$ or the like. Then, the photo-resist pattern 152 and the transparent conductive film 154 thereon are simultaneously removed by a lift-off process to form the transparent conductive pattern including the pixel electrode 118, the upper gate pad electrode 132, the upper data pad electrode 140 and the second upper storage electrode 125, as shown in FIG. 6F. At this time, the pixel hole 160 and the first to third contact holes 124, 130 and 138 passing through the protective film 150 are used as a stripper infiltration path A, thereby enabling easy separation of the photo-resist pattern 152 from the protective film 150.

The pixel electrode 118 interfaces with the protective film 150 patterned within the pixel hole 160 and is connected, on a side surface basis, to the drain electrode 112 and the first upper storage electrode 122. The second upper storage electrode 125 interfaces with the protective film 150 patterned within the first contact hole 124 and is connected, on a side surface basis, to the first upper storage electrode 122. The upper gate pad electrode 132 interfaces with the protective film 150 patterned within the second contact hole 130 and is connected to the lower gate pad electrode 128 under it. The upper data pad electrode 132 interfaces with the protective film 150 patterned within the third contact hole 138 and is connected, on a side surface basis, to the lower data pad electrode 136.

As mentioned above, the thin film transistor substrate according to an embodiment of the present invention is provided by a first mask process forming the gate metal pattern, a second mask process forming the semiconductor pattern and the source/drain metal pattern, a third mask process patterning the protective film and the gate insulating pattern, a lift-off process forming the transparent conductive pattern. Accordingly, it becomes possible to simplify the semiconductor manufacturing process because of the reduction in the number of mask processes and thus reducing manufacturing costs.

In another embodiment of the present invention, the lift-off ability in separating the photo-resist pattern covered with the transparent conductive film from the substrate is improved using a slit into the protective film to provide additional stripper infiltration paths. The slits are formed to provide a path through which a stripper can easily infiltrated into an interface between the photo-resist pattern and the protective film to improve a lift-off ability of the photo-resist pattern. The slits are formed in the non-display areas rather than in the display areas having the thin film transistor and the pixel electrode. This is because the stripper infiltration path A is sufficient for the pixel hole 160 because the path is relatively wide and the stripper does not have to go very far in the display area, as shown in FIG. 6E. However, a stripper infiltration paths A for the contact holes 130 and 138 of the gate pad 126 and the data pad 134 is insufficient because the path is narrow and the stripper has to travel farther while spreading out more. Hereinafter, exemplary cases where an additional stripper infiltration path, that is, a slit is provided in the thin film transistor substrate will be described with reference to FIG. 7A to FIG. 11C.

Figure 7A:
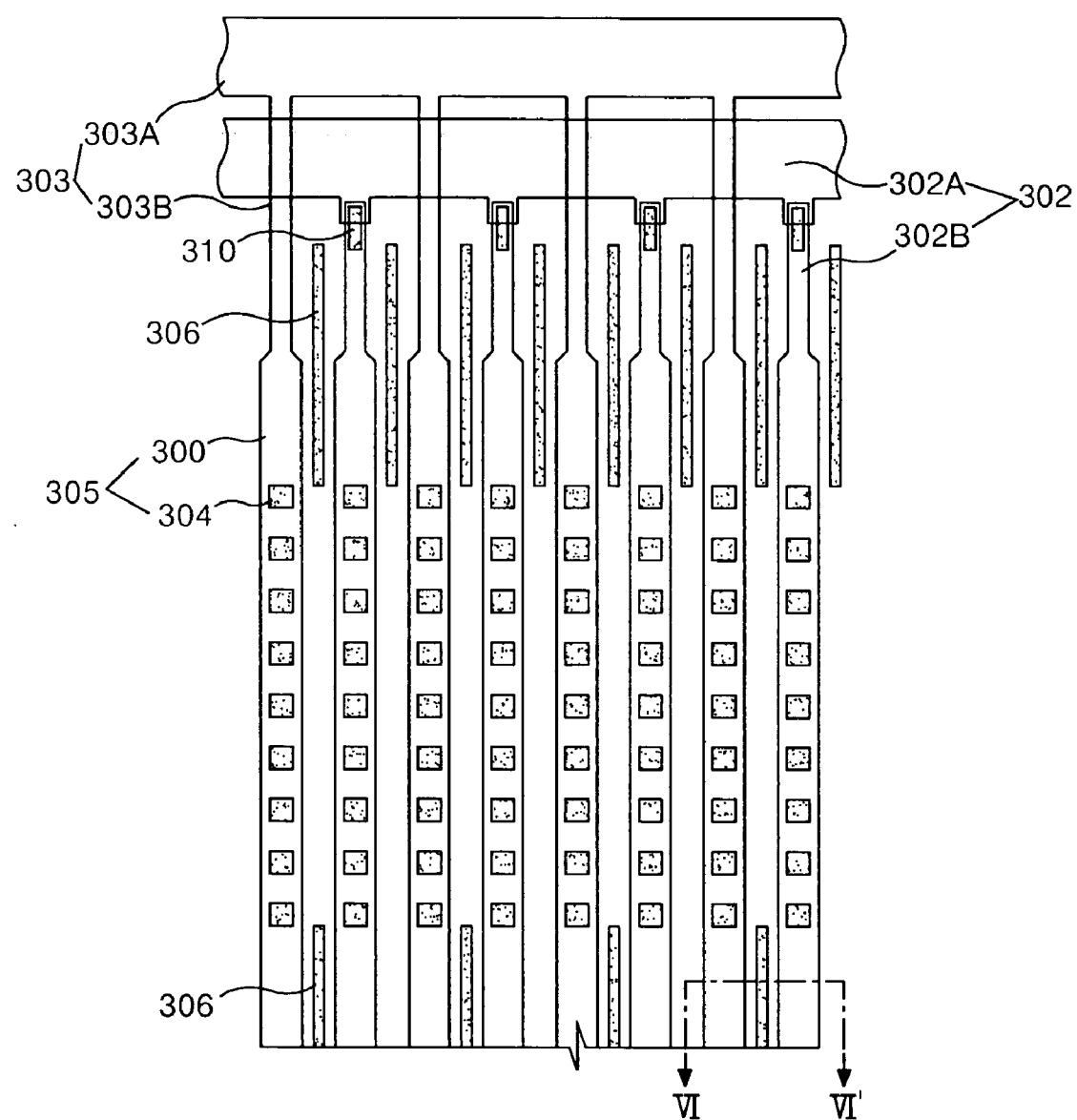
FIG. 7A and FIG. 7B are a plan view and a cross-sectional view showing a portion of a gate pad area in a thin film transistor substrate according to another embodiment of the present invention, respectively.
Figure 7B:
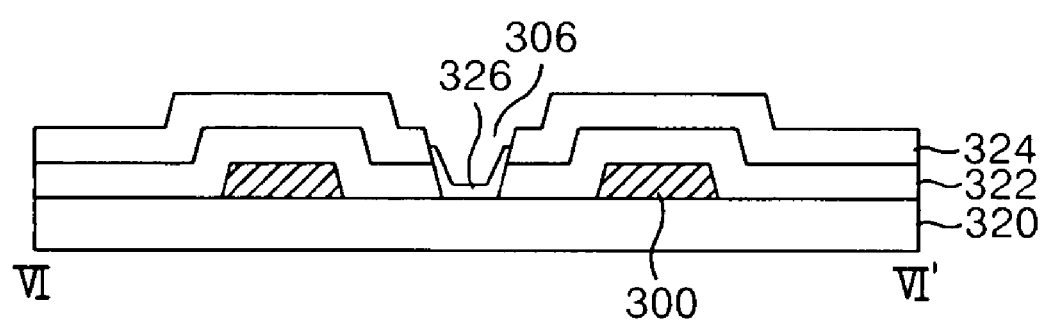

FIG. 7A and FIG. 7B partially show the gate pad area of the non-display area, which includes a plurality of gate pads 305 formed in parallel to each other. The gate pad 305 includes a lower gate pad electrode 300 and an upper gate pad electrode 304 connected to the lower gate pad electrode 300 within a plurality of contact holes passing through the protective film 324 and the gate insulating film 322. The lower gate pad electrode 300 is connected, via a gate link (not shown), to a gate line (not shown) provided within the display area.

The lower gate pad electrode 300 is connected to even and odd shorting bars 302 and 303 provided at the outer side of the pad area for signal inspection after a fabrication of the thin film transistor substrate. The even shorting bar 302 is commonly connected to a plurality of even lower gate pad electrodes 300 while the odd shorting bar 303 is commonly connected to a plurality of odd lower gate pad electrodes 300. A vertical part 303A and a horizontal part 303B of the odd shorting bar 303 are formed from the same gate metal as the lower gate pad electrode 300. A vertical part 302 of the even shorting bar 302 formed from the gate meal is connected, via a contact electrode 310, to the horizontal part 303B formed from the source/drain metal.

The gate pad area further includes a slit 306 formed as a stripper infiltration path between the signal lines. For instance, the slit 306 is formed in such a manner to pass through the protective film 324 and the gate insulating film 322 in an area between the gate pads 305 but separated from an area between upper gate pad electrodes 304. For example, the slit 306 is provided in an area between the gate pads 305 other than in an area adjacent to the upper gate pad electrode 304, which is made from a transparent conductive film. This positioning of the slit 306 prevents shorts between the upper gate pad electrodes 304 adjacent to each other on the left and right sides as a result of transparent conductive pattern 326 being left in the slit 306 by the lift-off process connecting with transparent conductive 326 adhering to the transparent conductive film of the upper gate pad electrodes. A slit 306 near the outer side extends between the vertical parts 302B and 303B of the shorting bar. A slit 306 near the display area extends toward gate links (not shown). The contact hole provided by the upper gate pad electrode 304 through the protective film 324 is also a stripper infiltration path.

Figure 8A:
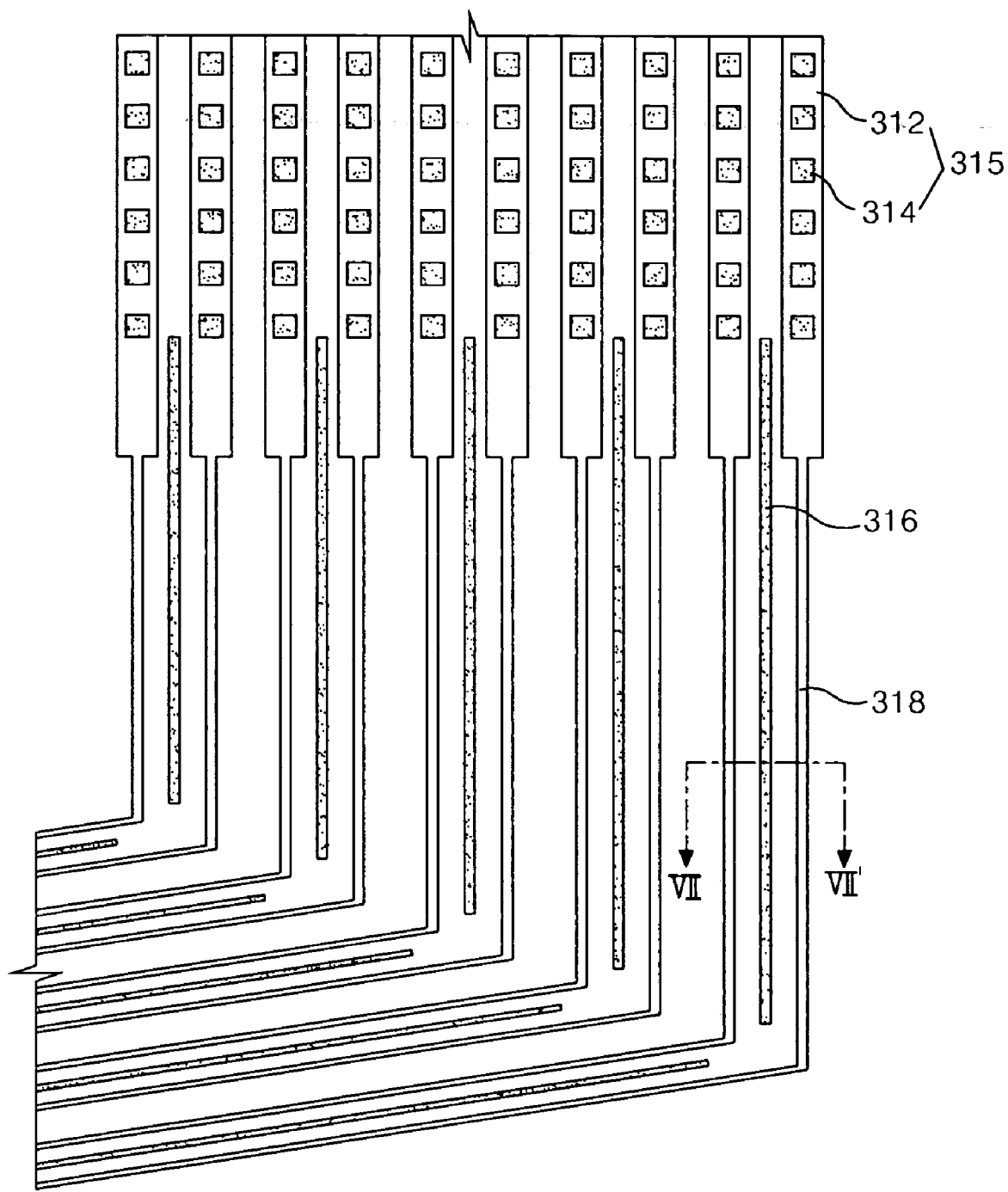
FIG. 8A and FIG. 8B are a plan view and a cross-sectional view showing a portion of a data pad area in a thin film transistor substrate according to another embodiment of the present invention, respectively.
Figure 8B:
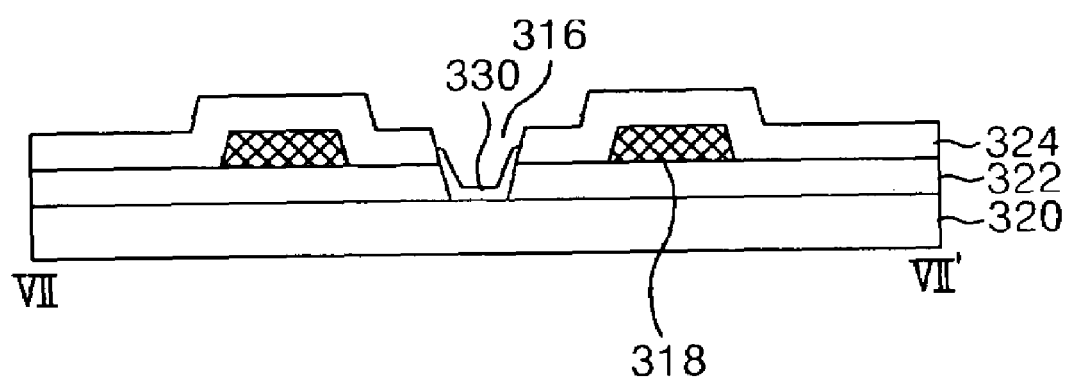

FIG. 8A and FIG. 8B show the data pad area of the non-display area with emphasis on the link portion, which includes a plurality of data pads 315 and data links 318 arranged in parallel to each other. The data pad 315 consists of a lower data pad electrode 312, and an upper data pad electrode 314 within a plurality of contact holes passing through the protective film 324 and the gate insulating film 322 connected to the lower data pad electrode 312. The lower data pad electrode 312 is connected, via a data link 318 having a bent shape, to the data line (not shown) in the display area. Further, the lower data pad electrode 312 is connected to even and odd shorting bars (not shown) provided at the outer side of the pad area in order to make a signal inspection after a fabrication of the thin film transistor substrate.

The data pad area further includes a slit 316 formed as a stripper infiltration path between the signal lines. For instance, the slit 316 passes through the protective film 324 and the gate insulating film 322 between the data pads 315 and between the data links 318. Also, the slit 316 is positioned in such a manner as to be separated from an area in between the data pads 315 and between the data links 318. For example, the slit 316 is provided at the remaining area other than an area adjacent to the upper data pad electrode 314 formed from a transparent conductive film between the data pads. The slit 316 standing toward the display area between the data pads 315 is extended until between the data links 318. Alternatively, the slit 316 may be provided between a plurality of data pads 315 and between a plurality of data links 318. Also, the contact hole for the upper data pad electrode 314 is used as a stripper infiltration path.

Figure 9A:
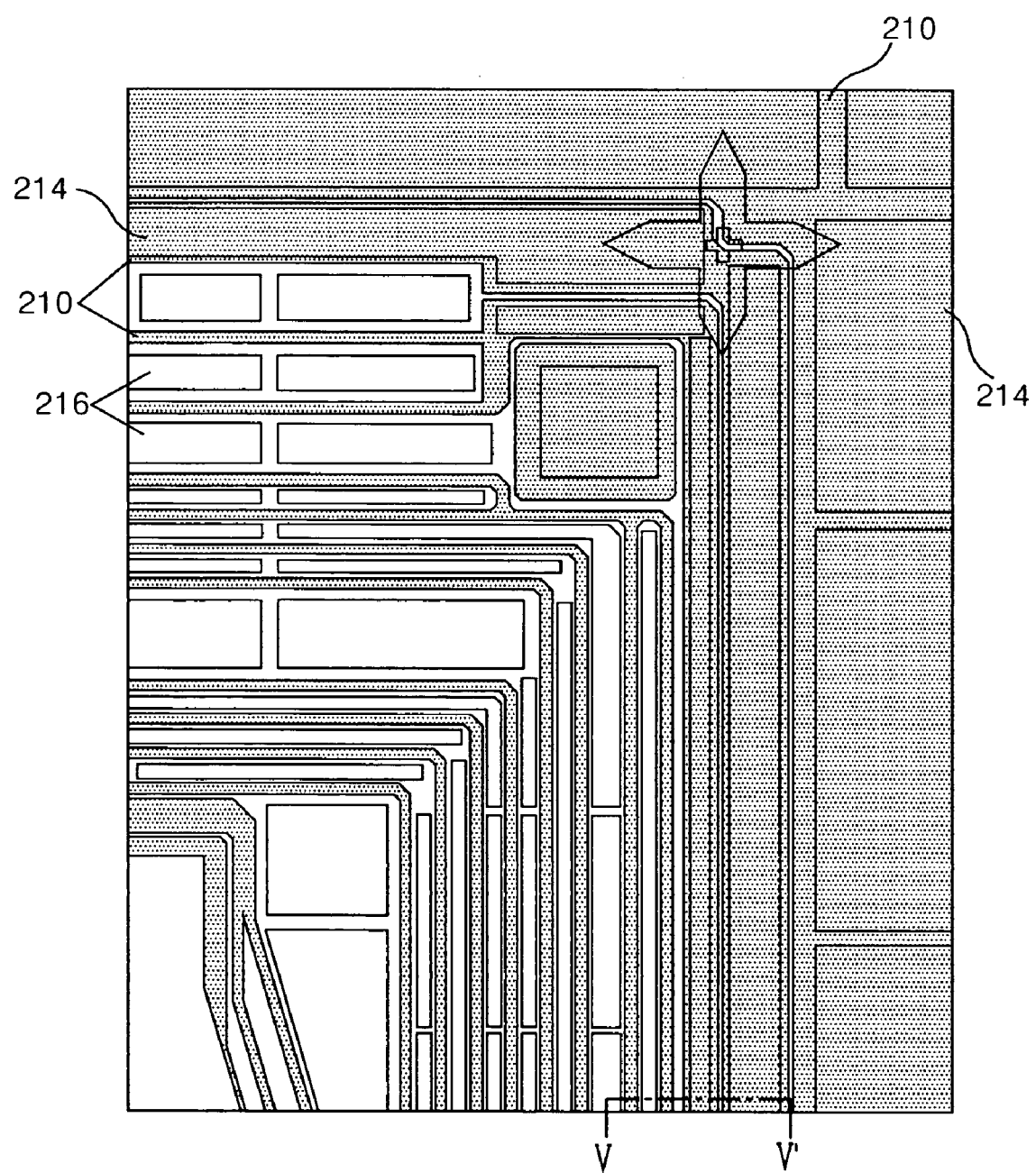
FIG. 9A and FIG. 9B are a plan view and a cross-sectional view showing a portion of a line on glass area in a thin film transistor substrate according to another embodiment of the present invention, respectively.
Figure 9B:
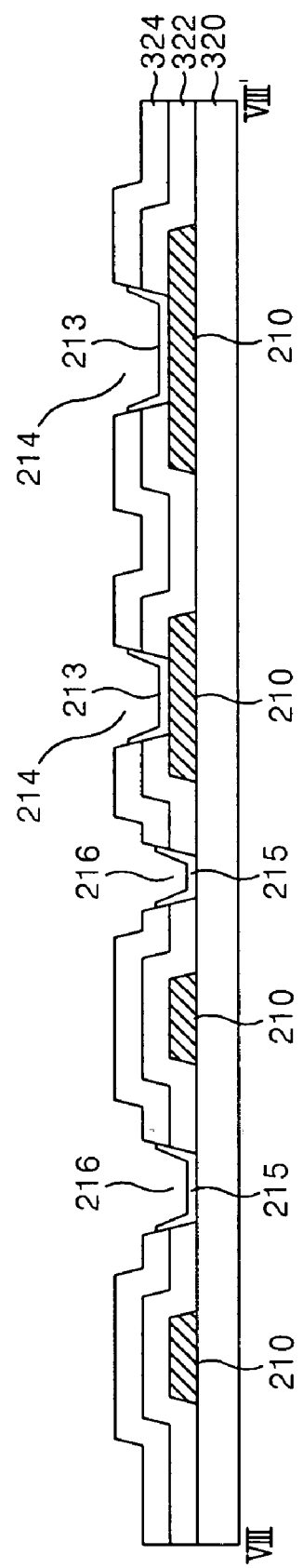

FIG. 9A and FIG. 9B partially show a line on glass (LOG) area between the gate pad portion and the data pad portion of the non-display area, which includes a plurality of LOG-type signal lines formed independently of each other. The LOG-type signal line 210 plays a role to apply gate control signals and power signals via a tape carrier package (TCP) mounted with the data driver to a gate TCP mounted with the gate driver. More specifically, the plurality of LOG-type signal lines 210 supply direct current voltages from a power supply, such as a gate low voltage VGL, a gate high voltage VGH, a common voltage VCOM, a ground voltage GND and a base driving voltage VCC; and gate control signals from a timing controller, such as a gate start pulse GSP, a gate shift clock GSC and a gate enable signal GOE. Such an LOG-type signal line 210 has an advantage in that it permits an elimination of a gate printed circuit board (PCB) attached onto the gate TCP.

The LOG area further includes slits 214 and 216 formed as a stripper infiltration path above the LOG-type signal lines 210 and between the LOG-type signal lines 210. For instance, the slit 214 provided above the LOG-type signal line 210 and the slit 216 provided between the LOG-type signal lines 210 pass through the protective film 324 and the gate insulating film 322. Also, the slits 214 and 216 are formed in such a manner as to be separated into a plurality of slits above the LOG-type signal line 210 and between the LOG-type signal lines 210. Transparent conductive patterns 213 and 215 are left at such slits 214 and 216 as a result of the lift-off process.

Figure 10A:
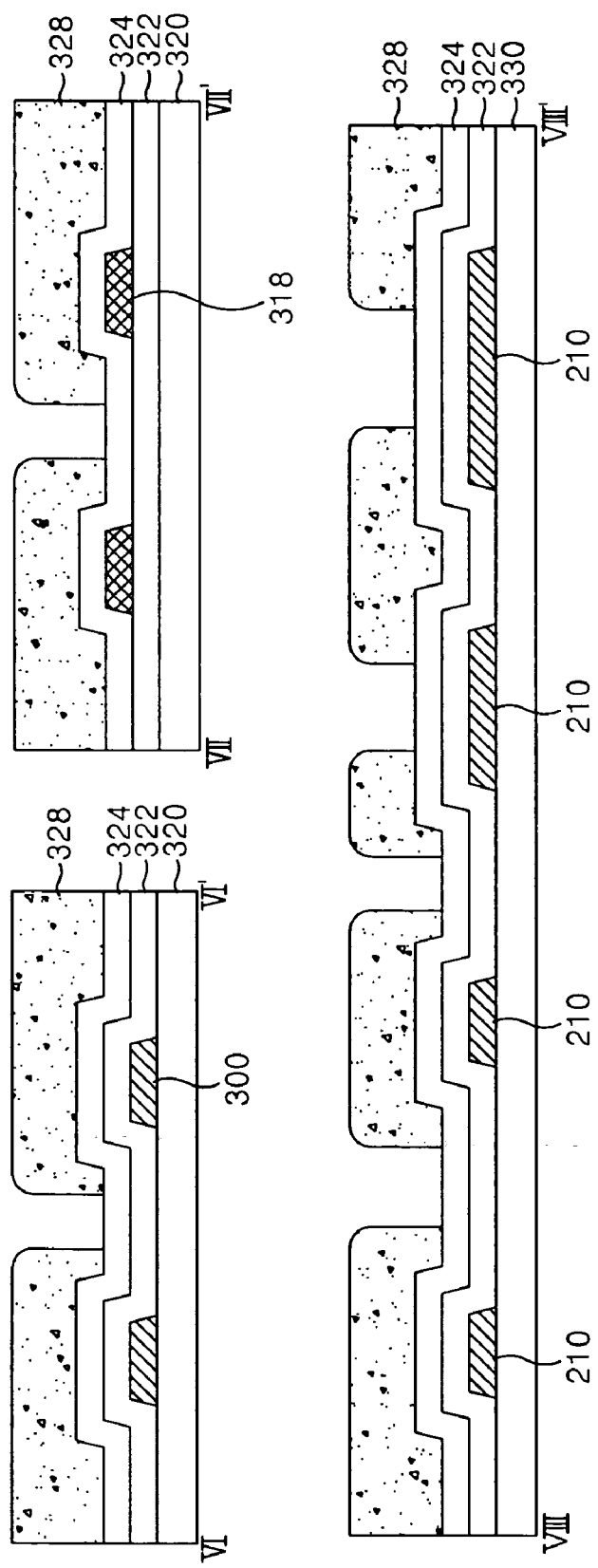
Figure 10C:
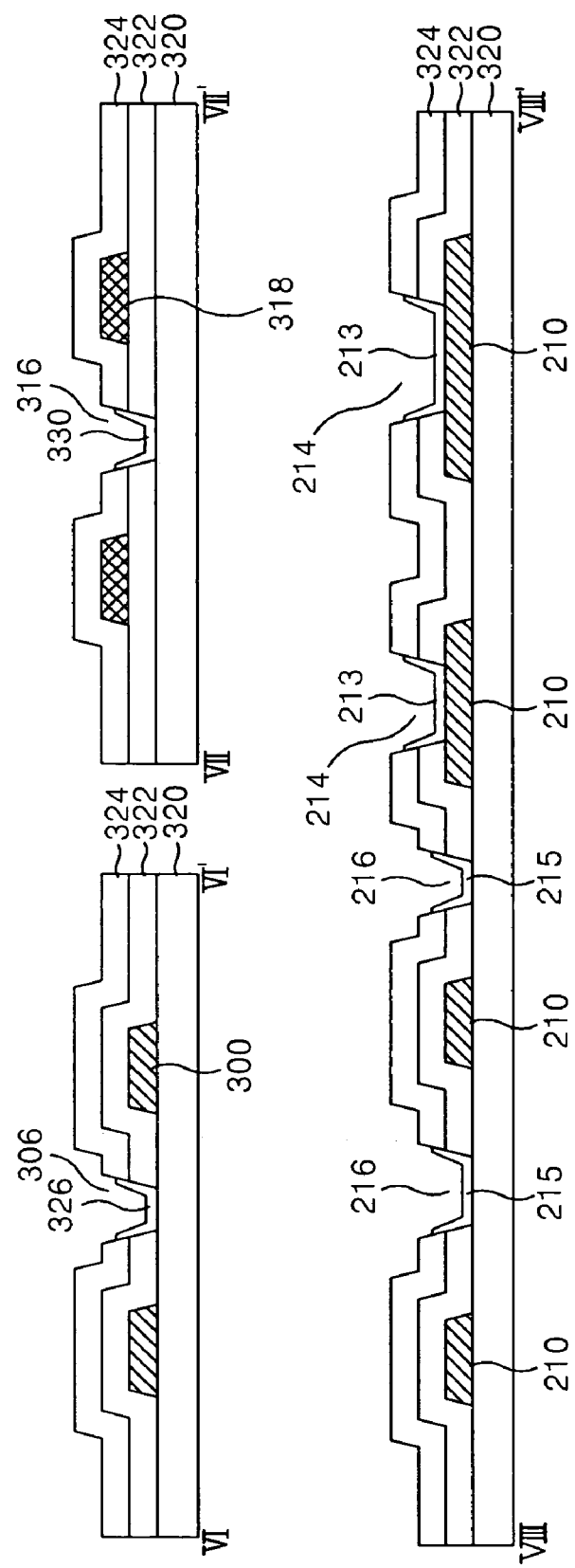

FIG. 10A to FIG. 10C are cross-sectional views showing a method of fabricating the gate pad area, the data pad area and the LOG area shown in FIG. 7B, FIG. 8B and FIG. 9B, respectively. Referring to FIG. 10A, the lower gate pad electrode 300, the gate link (not shown) and the LOG-type signal line 210 are simultaneously formed by a first mask process for providing the gate metal pattern. Subsequently, the gate insulating film 322 is formed thereon. Then, the data link 318, along with the lower data pad electrode 312, is formed on the gate insulating film 322 by the second mask process, which also provides the source/drain metal pattern and the semiconductor pattern. Subsequently, the protective film 324 is formed, and the photo-resist pattern 328 for patterning the protective film 324 is formed thereon by a third mask process. The photo-resist pattern 328 has a shape in which the protective film 324 is opened at portion corresponding to contact holes and slits.

Referring to FIG. 10B, the protective film 324 and the gate insulating film 322 are etched along the photo-resist pattern 328 to form slits 306, 316, 214 and 216 along with the contact holes (not shown) of the pad portion. Then, the transparent conductive film 325 is coated in a state in which the photo-resist pattern 328 is not removed. Subsequently, the photo-resist pattern 328 covered with the transparent conductive film 325 is removed by means of a stripper to leave the transparent conductive film patterns 326, 330, 213 and 215 within the slits 306, 316, 214 and 216, as shown in FIG. 10C, along with the upper gate and data pad electrodes 304 and 314 within the contact hole. In this case, the slits 306, 316, 214 and 216 provided at the protective film 324 and the gate insulating film 322 and the contact hole at the pad portion are used as the stripper infiltration path A.

A lot of stripper infiltrates through the stripper infiltration path A, into interface portions between the photo-resist pattern 328 and the protective film 324, so that the photo-resist pattern 328 covered with the transparent conductive film 325 can be easily separated from the protective film 324. This is because the edge portion of the photo-resist pattern 328 has a shape more protruded than the edge portion of the protective film 324 due to an over-etching of the protective film 324 at a portion of the protective film 324 provided with the slits 306, 316, 214 and 216 and the contact hole. The transparent conductive film 325 is deposited with a linearity between the edge portions of the photo-resist pattern 328 and the protective film 324 such that an opening occurs at the edge portion of the protruded photo-resist pattern 328, or is relatively thinly deposited. Thus, stripper can easily infiltrate into the opening or thinly deposited transparent conductive film 324 between the photo-resist pattern 328 and the protective film 324.

As described above, according to embodiments of the present invention, the lift-off process is used to implement a process using a three-round mask process, thereby reducing the manufacturing cost as well as improving the production yield. Furthermore, according to embodiments of the present invention, a plurality of slits used as stripper infiltration paths are provided above the signal lines and between the signal lines, thereby improving lift-off ability of the photo-resist pattern covered with a transparent conductive film.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a thin film transistor substrate for a display device having a plurality of thin film transistors and pixel electrodes connected to the thin film transistors, said method comprising the steps of:
    forming a gate insulating film in a display area and in a non-display area of the display device;
    forming a plurality of signal lines on the gate insulating film in the non-display area for applying signals to the thin film transistors in the display area;
    forming a protective film covering the thin film transistors and the signal lines;
    forming a photo-resist pattern on the protective film;
    patterning the protective film and the gate insulating film using the photo-resist pattern to form a slit adjacent to the plurality of signal lines;
    forming a transparent conductive film on the photo-resist pattern and within the slit; and
    removing the photo-resist pattern and a portion of the transparent conductive film on the photo-resist pattern with a stripper that infiltrates between the photo-resist pattern and the protective film through the slit.

2. The method as claimed in claim 1, wherein said step of forming a plurality of signal lines includes:
    forming a gate line and a data line connected to the thin film transistor with the gate insulating film therebetween so that the gate line and data line cross each other and define a pixel area.

3. The method as claimed in claim 2, further comprising the steps of:
    forming a gate link connected to the gate line and a lower gate pad electrode connected to the gate link in said non-display area during formation of the plurality of signal lines;
    forming a plurality of contact holes passing through the gate insulating film and the protective film above the lower gate pad electrode at the same time as forming the slit during the patterning step; and
    forming an upper gate pad electrode within the plurality of contact holes during formation of the pixel electrode.

4. The method as claimed in claim 3, wherein the slit passes through the protective film and the gate insulating film at a portion between the gate pads or between the gate links.

5. The method as claimed in claim 3, wherein the slit between the gate pads is separately formed in such a manner as to avoid an area adjacent to the upper gate pad electrode.

6. The method as claimed in claim 4, wherein the slit between the gate pads is also between the gate links.

7. The method as claimed in claim 2, further comprising the steps of:
    forming a data link connected to the data line and a lower data pad electrode connected to the data link in said non-display area during formation of the signal lines;
    forming a plurality of contact holes passing through the protective film on the lower data pad electrode at the same time as forming the slit during the patterning step; and forming an upper data pad electrode within the plurality of contact holes.

8. The method as claimed in claim 7, wherein the slit passes through the protective film and the gate insulating film at a portion between the data pads or between the data links.

9. The method as claimed in claim 8, wherein the slit between the data pads is separately formed in such a manner as to avoid an area adjacent to the upper data pad electrode.

10. The method as claimed in claim 8, wherein the slit between the data pads is also between the data links.

11. The method as claimed in claim 1, wherein said step of forming the signal lines includes:
    forming a line on glass (LOG) type signal line for supplying a driving signal required for a driver driving the gate lines and the data lines at said non-display area.

12. The method as claimed in claim 11, wherein the slit passes through the protective film and the gate insulating film above the LOG-type signal line or between the LOG-type signal lines.

13. The method as claimed in claim 1, wherein during formation of the slit, the protective film is over-etched such that the edge portion of the photo-resist pattern is more protruded than that of the protective film.

14. The method as claimed in claim 1, further comprising the step of:
    forming shorting bars connected to the signal lines during formation of the plurality of signal lines, wherein a slit also is provided between the shorting bars.

15. The method as claimed in claim 3, wherein the transparent conductive film is also formed in the contact holes during the patterning step.

16. The method as claimed in claim 15, wherein after the removing step, a portion of the transparent conductive film remains in the contact holes.

17. The method as claimed in claim 1, wherein after the removing step, a portion of the transparent conductive film remains in the slit.

18. The method as claimed in claim 1, wherein after the removing step, a transparent conductive pattern is left within the slit.

* * * * *